United States Patent [19]

Yamazaki et al.

[11] Patent Number: 4,910,044

[45] Date of Patent: Mar. 20, 1990

[54] ULTRAVIOLET LIGHT EMITTING DEVICE AND APPLICATION THEREOF

[75] Inventors: Shunpei Yamazaki, Tokyo; Kazuo Urata, Atsugi; Mamoru Tashiro, Tokyo; Yuji Tanamura, Machida; Shinji Imato, Atsugi; Takashi Inujima, Atsugi; Shigenori Hayashi, Atsugi, all of Japan

[73] Assignee: Semiconductor Energy Laboratory Co., Ltd., Kanagawa, Japan

[21] Appl. No.: 240,364

[22] Filed: Sep. 1, 1988

Related U.S. Application Data

[63] Continuation-in-part of Ser. No. 912,060, Sep. 26, 1986, abandoned.

[30] Foreign Application Priority Data

Sep. 30, 1985 [JP] Japan .................................. 60-217545
Jun. 10, 1986 [JP] Japan .................................. 61-134074

[51] Int. Cl.$^4$ ............................................. B05D 3/06
[52] U.S. Cl. ........................................ 427/54.1; 313/577; 315/111.21

[58] Field of Search ................ 313/565, 577, 637, 638; 315/111.21, 108; 427/54.1

[56] References Cited

U.S. PATENT DOCUMENTS

| 1,917,848 | 7/1933 | Marden et al. | 313/565 |
| 4,435,445 | 3/1984 | Allred et al. | 427/54.1 |
| 4,558,660 | 12/1985 | Nishizawa et al. | 118/50.1 |
| 4,585,671 | 4/1986 | Kitagawa et al. | 427/54.1 |
| 4,735,821 | 4/1988 | Yamazaki et al. | 427/54.1 |

FOREIGN PATENT DOCUMENTS 2268753 11/1975 France .

Primary Examiner—Robert L. Griffin
Assistant Examiner—T. Salindong
Attorney, Agent, or Firm—Sixbey, Friedman, Leedom & Ferguson

[57] ABSTRACT

Ultraviolet light is emitted mainly with 185 nm in wave length so that a thick silicon layer is fabricated by decomposition of silane gas at a high deposition speed. As a light source, a bulb is filled with an amount of mercury gas without dosing argon gas which enhances preferentially light with 254 nm in wave length.

7 Claims, 6 Drawing Sheets

ULTRAVIOLET LIGHT EMITTING DEVICE AND APPLICATION THEREOF

This application is a continuation-in-part of Ser. No. 912,060, filed 9/26/86, now abandoned.

BACKGROUND OF THE INVENTION

This invention relates to a light emitting device and its application, more particularly, to an improved ultraviolet light emitting device and its application in which light emission is made preferentialy at a desired wavelength for optimum deposition with good stability.

A low pressure mercury lamp has been broadly used in the field of semiconductors due to its high performance of ultraviolet light emission. Especially, photo CVD for forming semiconductor layers on a substrate is advantageous to carry out the deposition at a relatively low temperature with chemical reaction taking place under the existence of ultraviolet radiation. The photo CVD method is superior to CVD methods of other types, e.g., thermal CVD or plasma CVD, in that the deposition will not injure the surface of a substrate on which a layer is deposited.

One example of such a photo CVD apparatus is shown in FIG. 1. The apparatus comprises a reaction chamber 2 in which substrates 1 are disposed, a heater 3 for heating the substrates 1 to a predetermined temperature, a low pressure mercury lamp 9 for irradiating the substrates 1 with ultraviolet light through a light window 16, a reactant gas supply system 7 for supplying reaction gas to the reaction chamber 2 through a mercury bubbler 13 and a exhausting system provided with a rotary pump 19. In the chamber 2, a chemical reaction with reactant gas introduced from the supply system 7 sets up, and the gas component is decomposed by virtue of ultraviolet light depositing thereby on the substrates 1 the decomposed product, e.g., an amorphous silicon layer at 250° C. The amorphous silicon layer, however, is deposited also on the light window 16 which normally made of quartz. To prevent the silicon layer from being deposited, the window is coated with Fomblin oil 16 (a Trademark of an oil of fluoride composition).

A problem of the prior art is a low deposition speed. One measure to solve the above problem is the provision of the mercury bubbler 13 which doses mercury vapor into the reactant gas as a sensitizer. The mercury vapor, in turn, has a potential to be involved in pollution problem. Thus, it would be most desirable in the semiconductor field to prepare a deposition method which can form a semiconductor layer at high speed without the arising pollution problem.

The deposition speed largely depends on the ultraviolet light incident on the reaction gas from the light source. The chemical reaction producing a material to be deposited is set up with radiation from the mercury lamp 9. Accordingly, the wavelength and the intensity of the light are of most importance to make the deposition efficient.

The mercury lamp as a light source is generally comprised of a bulb which contained an amount of mercury gas at several torrs mixed with argon gas. Opposed ends of the bulb are provided with electrodes between which electron discharge is to take place. Within the discharge, argon atoms and mercury atoms are supplied with their exciting energy through collision with electrons.

Referring to FIG. 2, there are illustrated some energy levels of mercury and argon which are referred to in this description. In this graphical diagram, $3^1P_1$ represents the energy state having a principal quantum number of 3, an orbital type of "p", a spin multiplied degree of 1 in the presuperscript and a total magnetic momentum 1 in the subscript. Transitions among the levels take place in chemical vapor deposition according to scatterings of two types. One type is optical scattering type concerning an interaction between electromagnetic field and an electron of the atom. The other is elastic scattering type concerning an interaction between an electron of the atom and an electron from the electrode. The former gives rise to ultraviolet light emission on the basis of transition between two levels only with spin even, while the later causes an energy exchange between the electrons without forbidden transitions but according to the scattering cross section shown in FIG. 5.

According to experiments, mercury gas is easily exited when dosed with argon gas, compared to mercury gas alone. Further, the dose of argon gas also has a function to lessen scattering effect of the argon atoms on the discharge electrodes. Thus, argon gas is commercially dosed to mercury gas so as to initiate the discharge easily even under somewhat low energy supply with a low mercury pressure. The emission, however, takes place mainly at wave length of 254 nm as shown in FIG. 4. The inventors have conceived a hypothesis to explain the role of the dosed argon gas in the CVD action as follows. Namely, since having the large scattering cross section, argon atoms receive energy of electrons emitted from the electrodes more effectively than mercury atoms and change in their energy states from the ground level to the exited levels ELa. The excited argon atoms in turn collide with and render their energy to mercury atoms, pumping up same to the energy levels $^3P_0$, $^3P_1$ and $^3P_2$ from the ground level. Although the transitions between one of the three levels and the ground state are forbidden due to spin preservation in the first order apploximation, the transition of second order, which permit emission of light with 254 nm wave length, are observed where a major part of the excited states are occupied by electrons. On the other hand, the scattering cross section to the $^1P_1$ level is not so large especially in low energy region as shown in FIG. 5. Because of this, the prior art device has emitted mainly on the basis of the transition of electrons from the triplet levels, namely with the vicinity of 254 nm in wave length. In the semiconductor process, however, ultraviolet light with about 185 nm in wave length is favored rather than with 254 nm, especially when decomposition of silane ($Si_nH_{2n+2}$) is desired.

SUMMARY OF THE INVENTION

According to one aspect of the invention, the adverse effect of the dosed argon gas is eliminated. A desired discharge has been observed to take place by supplying sufficient energy even if the dose is dispensed with. Electrons with high energy comes into use when the pressure in the bulb is reduced to lengthen the mean free path of the electrons. Free from argon gas, mercury gas can radiate ultraviolet light with about 185 nm in wave length so that a thick layer can be formed at a high growing speed.

It is therefore an object of the invention to provide an emitting device capable of emitting a ultraviolet light mainly with about 185 nm in wave length.

It is another object of the invention is to provide an improved semiconductor processing method in which a thick layer can be deposited at a high growth speed.

The invention will be more fully appreciated in the light of the following detailed description of preferred embodiment of the invention. An appreciation of the invention will be further assisted by reference to the accompanying drawings, in which:

DETAILED DESCRIPTION OF THE PREFERRED EMBODIMENTS

Figure 1:
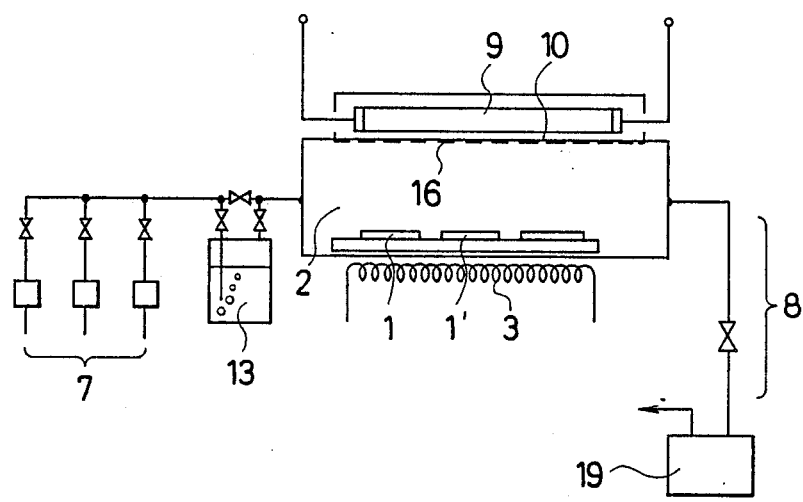
FIG. 1 is a block diagram of a prior art CVD apparatus.
Figure 2:
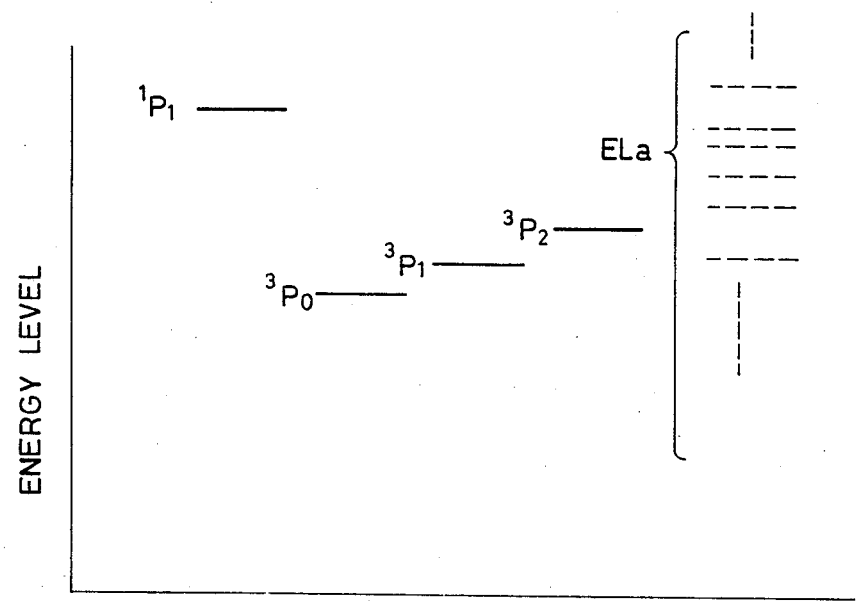
FIG. 2 is a graphical diagram showing energy levels of mercury and argon.
Figure 3:
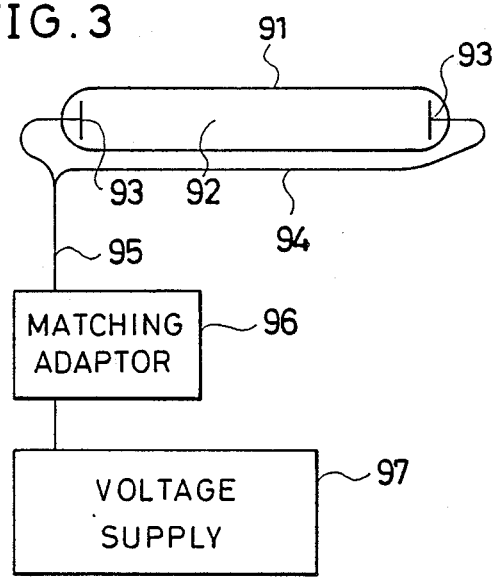
FIG. 3 is a block diagram of an emitting device in accordance with the invention.
Figure 4:
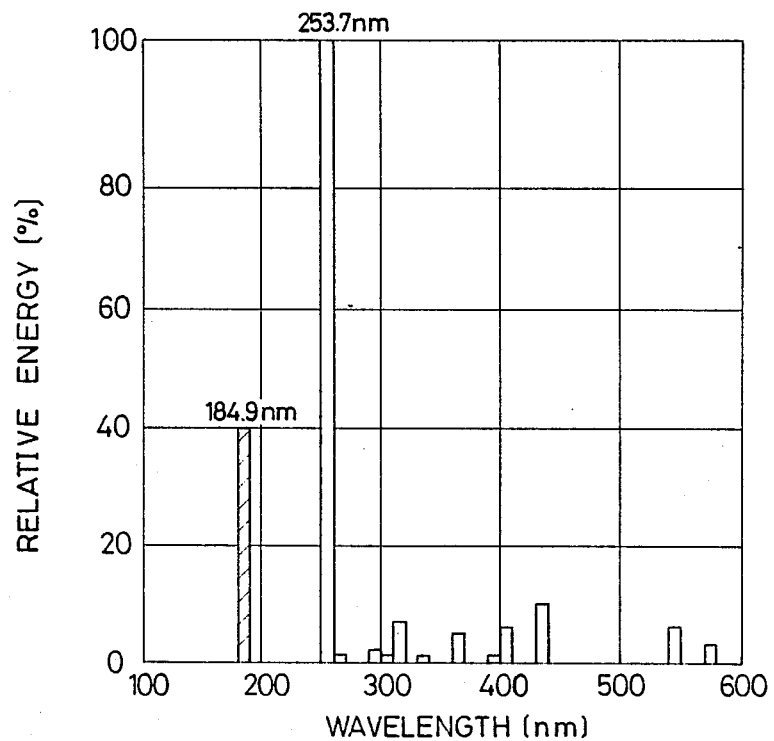
FIG. 4 is a graphical diagram showing emission spectrum according to a art.
Figure 5:
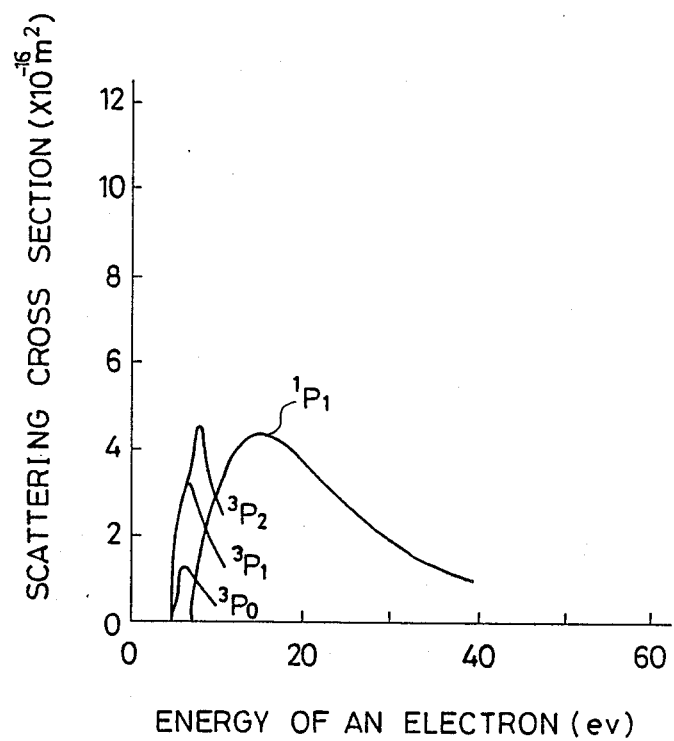
FIG. 5 is a graphical diagram showing the scattering cross section of energy states of mercury.
Figure 6:
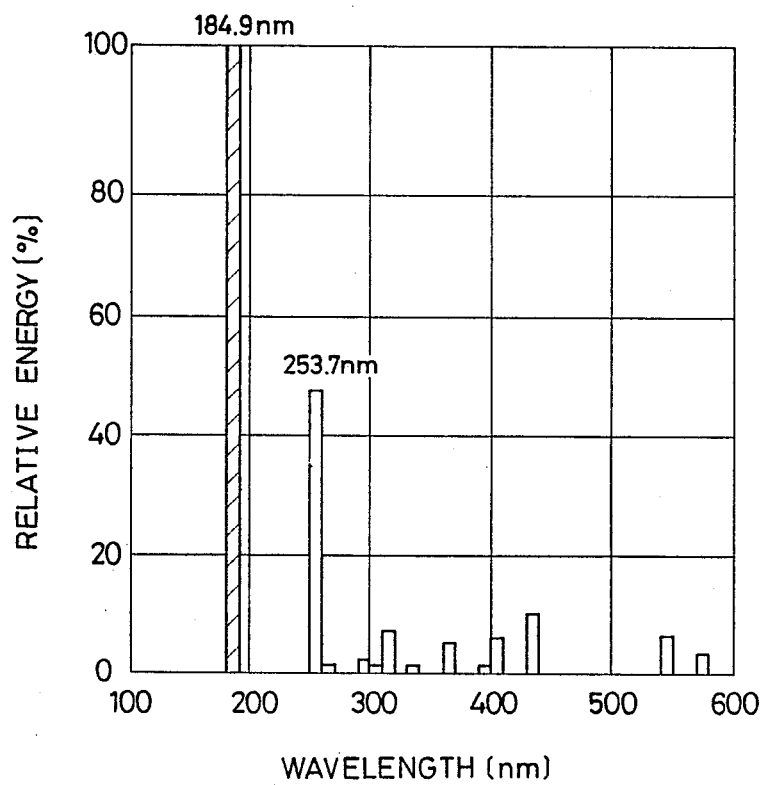
FIG. 6 is a graphical diagram showing emission spectrum according to the invention.

Referring to FIG. 3, an emitting device according to the invention is illustrated. The emitting device comprises a bulb 91 which is filled with mercury gas 92 at a suitable pressure without being dosed with argon gas, a high frequency voltage supply 97 provided with a matching adaptor 96 and a pair of electrodes 93 provided on the both ends of the bulb 91 and supplied with a high frequency voltage from the voltage supply 97 through a coaxial cable 95 and a pair of lines 94 for discharging electrons. The matching adaptor 96 is prepared to prevent the discharge between the electrodes 93 from falling into unstable condition due to a negative component of the discharge bulb or the other cause. Although the following experiment of the embodiment was carried out at the frequency of 13.56 MHz, The bulb was reliable to discharge in the range from 1 KHz to 2.54 GHz by trial lightings. The pressure in the bulb 91 was chosen about 1 mm torr so that the electron can obtain the energy correspoding to the optimum power of electrons corresponding to 15 to 20 eV at which transition to the $^1P_1$ level may happen. Although the energy of the electron increases with the pressure of the gas in the chamber decreasing, In case where the pressure is decreased too low, discharge between the electrodes became difficult to occur. The range of the pressure may be between 0.1 to 2 militorr With power supply of 300 W, the bulb 1 radiated light as in FIG. 6. The energy of the light having a wave length of 185 nm was significantly high compared with the prior art while the light of 254 nm was limited.

Figure 7:
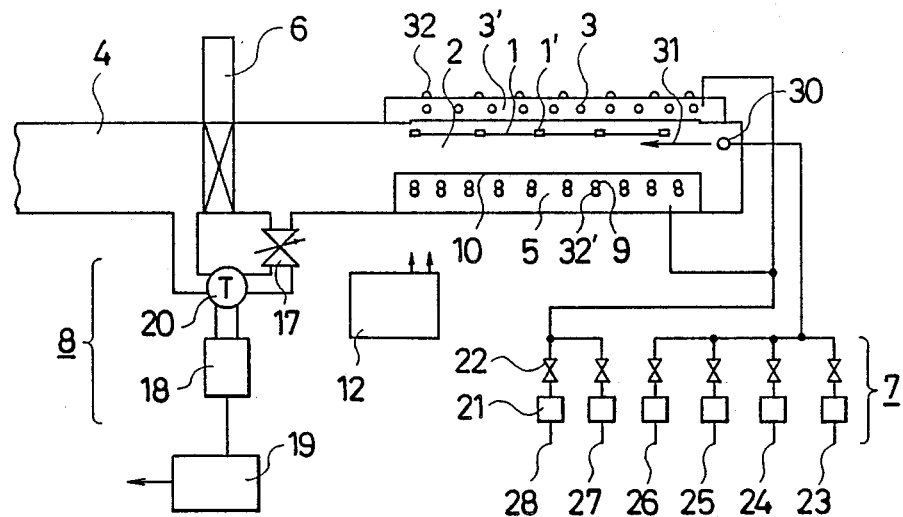
FIG. 7 is a CVD apparatus according to the invention.

Referring now to FIG. 7, a photo CVD apparatus having the light emitting device according to the invention is shown. In the figure, substrates 1 are supported by holders 1' just below heater chamber 3' which is provided with a plurality of halogen heaters 3 therein and a water cooling 32 thereon. The substrates 1 are prepared with principal surfaces looking downward on which deposition is to be made. The lower surface is irradiated with ultraviolet light by the mercury lamps 9 having the same configuration already described in the preceding as an embodiment of the invention. The mercury lamps are arranged in a light source chamber 5 and provided with water coolings 32'. Both the light source chamber 5 and the heater chamber 3' are replenished with a gas which does not commit the chemical reaction in the reaction chamber 2, for example, nitrogen, hydrogen, helium or argon, from the line 27 through a flow meter 21 and a valve 22 in order to maintain the pressure at about 100 torrs or less in the heater chamber and the light source chamber.

Into the reaction chamber, through a line 23 a primary reactant gas is supplied which includes within itself a main element to be deposited as a layer. Through a line 26 a secondary reactant gas is supllied, e.g., oxide gas such as $O_2$, $N_2O$, $NO$ or $NO_2$, or nitride gas such as $NH_3$, $N_2H_2$, $NF_3$ or $NO_2$ which reacts on the primary reactant gas. The two reactant gases are introduced through the valves 22 mixed with a carrier gas which is in turn supplied from a line 24., For example, for depositing silicon, silane ($Si_nH_{2n+2}$ : $n \geq 1$) such as monosilane and silicon fluoride ($SiF_2$, $SiF_4$, $Si_2F_6$ or $H_2SiF_2$) can be supplied from line 23. As a carrier gas, hydrogen gas, nitrogen or helium gas is suitable. For depositing nitride such as silicon nitride, aluminium nitride, galium nitride, tin nitride, indium nitride or antimony nitride, primary reactant gases are chosen respectively from $Si_2H_6$, $Al(CH_3)_3$, $Ga(CH_3)_3$, $In(CH_3)_3$, $Sn(CH_3)_3$ and $Sb(CH_3)_3$. In addition, ammonia gas or hydrazine gas is supplied as a secondary reactant gas through the line 26. The two reactant gases are introduced into the reaction chamber with a carrier gas such as hydrogen or helium through the lines 24 and 28. Further, for depositing oxide such as silicon oxide, phosphorous glass, boron glass, aluminium oxide, indium oxide, tin oxide, antimony oxide or mixtures thereof, the primary reactive gas is respectively a silicide such as $SiH_4$, $Si_2H_6$ or $SiF_6$, an aluminium composition such as $Al(CH_3)_3$ or $Al(C_2H_5)_3$, an indium composition such as $In(CH_3)_3$ or $InCl_3$, a tin composition such as $SnCl_4$ or $Sn(CH_3)_4$ and an antimony composition such as $Sb(CH_3)_3$ or $SbCl_3$. This reactant gas is introduced with a carrier gas supplied from the line 25 and in addition to this, phosphine gas or dibolane gas may be supplied from the line 24, if necessary. Furthermore, for depositing conductive material such as aluminium, tungsten, molibdenum, titan or silicide thereof, the reactant gas is respective $Al(CH_3)_3$, $WF_6$, $W(C_2H_5)_5$, $TiCl_4$, $Ti(CH_3)_4$ or mixture thereof used together with $SiH_4$, $SiF_6$, $SiH_2$ or $SiF_4$. The carrier gas is hydrogen for this case.

The pressure of the inside gas of the reaction chamber is controlled by means of a rotary pump 19 and a turbo molecular pump 18 through a control valve 17 and a cock 20. The cock selectively switches over passages from the reaction chamber to a prechamber 4 provided on the prestage of the reaction chamber 2 and vice versa.

The deposition process is carried out so that the substrates, according to a load lock system, do not undergo large differential pressure during transportation between the prechamber 4 and the reaction chamber 2. Namely, after disposing the substrates 1 supported by the holders 1', the prechamber 4 is sufficiently evacuated. Then, with a gate valve 6 opened, the substrates 1 are transported together with the holders 1' to the reaction chamber 2 which has been evacuated less than $10^{-7}$ torr in advance. Thereafter, the valve 6 is closed in order to establish an isolation between the prechamber 4 and the reaction chamber 2.

To preclude the reactant gas from entering the light source chamber 5 and the heater chamber 3' in back flow, a nonreactant gas in the two chamber is leaked out, which will not react on the reactant gas, at 100 to 1500 cc/min into the light source chamber 5 and the heater chamber 3' whereas the reaction chamber is supplied with the secondary reactant gases such as ammonia gas. In this condition, the substrates 1 are subjected to this atmosphere in the reaction chamber 2 for about 30 minutes where active hydrogen atoms and active fluorine atoms are produced by virtue of ultraviolet radiation. The active atoms perform photo etching on the substrates 1 and remove oxide on the surface of the substrates on which the deposition will be carried out, making the surface clean. Then, the primary reactant gas is introduced into the reaction chamber 2 via a nozzle 30.

The light source chamber 5 contains 16 set of the mercury lamp 9 of a low pressure arc discharge type with a bulb made from systhetic quartz which radiates ultraviolet light of 185 nm or 254 nm in wave length, 40 cm in emission length, 20 mW/cm² to 200 mW/cm² in intensity of radiation with electricity demand of 45 to 500 W/hour. The filler gas and its pressure are chosen as described in the above.

The ultraviolet light passes through the transparent shielding window 10 and irradiates the reactant gas and the principal surface of the substrates 1 in the reaction chamber 2. The heater 3 is placed above the reaction chamber 2 according to so-called deposition up arrangement whereby no flake is falling on the substrates 1. The distance between the shield window 10 and the principal surface of the substrate 1 is chosen less than 3 cm, more preferably 0.5 to 2.0 cm. According to experiments of the inventors, it was found that Fomblin oil may be dispensed with from the principal surface of the substrate so that the pressure in the reaction chamber can be decreased to a very low pressure of background level, i.e., about $10^{-7}$ torr.

The reaction chamber 1 is made of stainless steel and the light source chamber as well so that there is no difficulty in carrying out deposition on a substrate of 30 cm wide×30 cm long.

Next, a description of our experiments showing the performance of the invention is in order.

In FIG. 7, introduced as reactant gases into the reaction chamber 2 at 3.0 torrs were ammonia gas at 50 cc/min through the line 25 and disilane gas at 20 cc/min through the line 23. The mercury lamps 9 were supplied with electric power at 50 Hz through a suitable matching coil. Further, introduced were nitrogen gas as a carrier gas at 200 cc/min through the line 26 and ammonia gas as a secondary reactant gas at 200 cc/min through the line 27.

Figure 8:
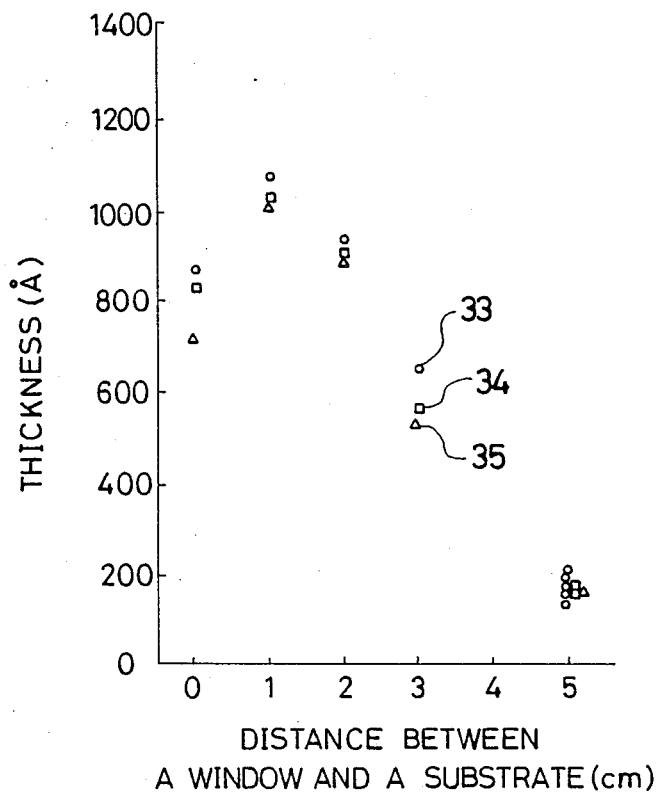
FIG. 8 is graphical diagram showing an experimental result according to the invention.

After reaction for 50 minutes, a silicon nitride layer was fabricated with 200 to 1100 Å in thickness as shown in FIG. 8. In the figure, a circle represents a datum obtained with the substrates heated to 300° C., a square with the substrates heated to 200° C. and triangular with the substrates heated to 100° C. It is easily understood from this results that the thickness of the deposited film depends not so much on the temperature of the substrate but largely depends on the distance between the substrate and the shielding window. The optimum distance for maximum thickness is about 1 cm and the distance must be chosen less than 2 cm when more than 500Å in thickness is desired.

Figure 9:
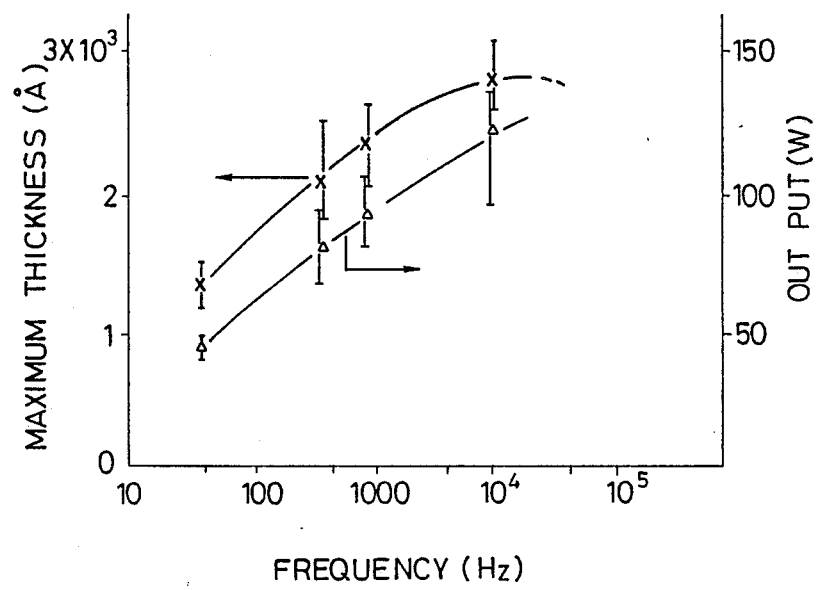
FIG. 9 is a graphical diagram showing the relation among the frequency of the supplied voltage, the maxmum thickness of a deposited layer and the output power.

FIG. 9 is a graphical diagram showing the result of another experiment. This experiment had been concieved to demonstrate the change of the thickness of the deposited film increasing as the power supplied to the mercury lamps increases. In this experiment, the matching coil has a little inductance so that large current can flow offsetting the negative coefficient of arc discharge. The large current stabilizes arc discharge, which tends to be localized on electrodes injuring same.

Further, it has been found that the electric power supplied to the mercury gas in the lamp increases with the frequency of the current increasing as shown in FIG. 9.

Emission of ultra-violet rays of 185 nm can be enhanced by the present invention. The conditions required to obtain such a desireable emission by a mercury lamp are detailed below. First, the frequency of input power to the mercury lamp is to be maintained higher than 100Hz and secondly, the pressure of the mercury gas contained within the lamp is chosen to be between 0.065–0.215 Torr. The pressure of the mercury gas within the lamp can also be expressed by the temperature of the mercury gas as being within the range between 75° C. and 95° C. The employment of these above-noted conditions has been found to intensify the ultraviolet rays at the wavelength of 185 nm. The ultraviolet rays at the wavelength of 185 nm. The ultraviolet rays at the wavelength of 185 nm are particularly favorable to the present invention for the decomposition of the reactive gas of the chemical vapor reaction.

While the present invention has been described with reference to several preferred embodiments thereof, many variations and modifications will now occur to those skilled in the art. It is our intent, therefore, to be limited solely by the scope of the appending claims and not by the specific embodiments disclosed herein. For example, an amorphous silicon film, a silicon oxide, a phosphorus or boro glass doped with impurity, an aluminium layer and so forth can be substituted with the silicon nitride film of the above embodiment.

What is claimed is:

1. A photo enhanced CVD method comprising:
    disposing a substrate in a reaction chamber;
    inputting a reactive gas into said reaction chamber; and
    initiating an optical reaction by irradiating said reactive gas with a UV light from a mercury lamp whereupon the product of said reaction is deposited on said substrate,
    wherein said mercury lamp is supplied with an AC power of a frequency higher than 100 Hz, and the distance between a window surface of said mercury lamp and said substrate is between 0.5 and 2 cm.

2. The method of claim 1 where said reactive gas is a silane gas.

3. A method of claim 1, wherein said silane is monosilane.

4. A method of claim 1 wherein said silane is disilane.

5. A method of claim 2 further comprising a step of introducing an amount of another reactant gas which forms a reactant mixture with said silane gas for forming a silicide layer on said substrate.

6. A photo-enhanced chemical vapor reaction method comprising:
   disposing an object to be treated in a reaction chamber;
   inputting a reactive gas into said reaction chamber; and
   initiating an optical reaction by irradiating said reactive gas with a UV light from a mercury lamp,
   wherein the pressure of the mercury gas is selected within a range between 0.065 Torr and 0.215 Torr, the frequency supplied to said mercury lamp is higher than 100 Hz, and the distance between a window surface of said mercury lamp and said object is between 0.5 and 2 cm.

7. A photo-enhanced chemical vapor reaction method comprising;
   disposing an object to be treated in a reaction chamber;
   inputting a reactive gas into said reaction chamber; and
   initiating an optical reaction by irradiating said reactive gas with a UV light from a light source,
   wherein the distance between said light source and said object is chosen to be from 0.5 to 2 cm.

* * * * *